(12) United States Patent
Xia et al.

(10) Patent No.: US 11,984,406 B2
(45) Date of Patent: May 14, 2024

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventors: Yunsheng Xia, Hefei (CN); Jen-Chou Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 241 days.

(21) Appl. No.: 17/386,470

(22) Filed: Jul. 27, 2021

(65) Prior Publication Data

US 2021/0358858 A1    Nov. 18, 2021

Related U.S. Application Data

(63) Continuation of application No. PCT/CN2021/079803, filed on Mar. 9, 2021.

(30) Foreign Application Priority Data

Mar. 30, 2020    (CN) .......................... 202010236043.5

(51) Int. Cl.
*H01L 23/544*    (2006.01)
*G03F 7/00*    (2006.01)
(Continued)

(52) U.S. Cl.
CPC ........ *H01L 23/544* (2013.01); *G03F 7/70633* (2013.01); *G03F 7/70683* (2013.01);
(Continued)

(58) Field of Classification Search
CPC . H01L 2223/54426; H01L 2223/54453; H01L 29/66795; H01L 29/785;
(Continued)

(56) References Cited

U.S. PATENT DOCUMENTS 5,889,335 A    3/1999 Kuroi
5,893,744 A    4/1999 Wang
(Continued)

FOREIGN PATENT DOCUMENTS

CN    102543667 A    7/2012
CN    107564914 A    1/2018
(Continued)

OTHER PUBLICATIONS

International Search Report in the international application No. PCT/CN2021/079803, dated May 28, 2021, 2 pgs.
(Continued)

*Primary Examiner* — Bilkis Jahan
*Assistant Examiner* — Victor V Barzykin
(74) *Attorney, Agent, or Firm* — Cooper Legal Group, LLC (57) ABSTRACT

The examples of the present application disclose a semiconductor structure and a method for manufacturing the same. The semiconductor structure includes: a functional structure and a first mark structure located on a substrate, in which the functional structure and the first mark structure have the same feature size; and a first dielectric layer located at the functional structure and the first mark structure, in which a thickness of the first dielectric layer at the functional structure is different from a thickness of the first dielectric layer at the first mark structure. The examples of the present application can improve the alignment accuracy of the manufacturing process and improve the product yield and production efficiency at the same time.

20 Claims, 9 Drawing Sheets

(51) Int. Cl.
 *G03F 9/00* (2006.01)
 *H01L 21/47* (2006.01)

(52) U.S. Cl.
 CPC ............ *G03F 9/7076* (2013.01); *H01L 21/47* (2013.01); *H01L 2223/54426* (2013.01); *H01L 2223/54453* (2013.01)

(58) Field of Classification Search
 CPC . H01L 23/544; G03F 7/70633; G03F 9/7076; G03F 7/70683
 See application file for complete search history.

(56) References Cited

U.S. PATENT DOCUMENTS

| | | | | |
|---|---|---|---|---|
| 5,958,800 | A * | 9/1999 | Yu | H01L 23/544 |
| | | | | 216/75 |
| 6,043,133 | A * | 3/2000 | Jang | H01L 21/76224 |
| | | | | 257/E21.546 |
| 6,180,537 | B1 | 1/2001 | Tseng | |
| 6,218,262 | B1 | 4/2001 | Kuroi | |
| 6,303,460 | B1 | 10/2001 | Iwamatsu | |
| 6,774,452 | B1 * | 8/2004 | Ramkumar | H01L 23/544 |
| | | | | 257/E23.179 |
| 7,381,508 | B2 | 6/2008 | Kang | G03F 9/7076 |
| | | | | 430/311 |
| 8,513,821 | B2 * | 8/2013 | Yao | G03F 7/70683 |
| | | | | 257/E23.179 |
| 9,129,905 | B2 * | 9/2015 | Hu | H01L 29/785 |
| 9,178,066 | B2 * | 11/2015 | Chiang | H01L 21/31144 |
| 9,202,788 | B2 * | 12/2015 | Okuno | G03F 7/70633 |
| 9,275,890 | B2 * | 3/2016 | Wei | H01L 23/544 |
| 9,490,217 | B1 | 11/2016 | Lin et al. | |
| 9,515,184 | B2 * | 12/2016 | Chiang | H01L 23/544 |
| 9,870,998 | B2 * | 1/2018 | Chiang | G03F 9/708 |
| 10,515,902 | B2 * | 12/2019 | Chiang | H01L 21/32139 |
| 10,534,276 | B1 * | 1/2020 | Yang | G03F 7/70683 |
| 10,535,573 | B2 * | 1/2020 | Wann | H01L 22/32 |
| 10,635,007 | B1 * | 4/2020 | Yang | G03F 7/70683 |
| 10,840,143 | B2 * | 11/2020 | Chiang | H01L 21/3085 |
| 10,957,653 | B2 * | 3/2021 | Chiang | H01L 21/32139 |
| 10,991,657 | B2 * | 4/2021 | Chen | H01L 21/31144 |
| 2002/0005594 | A1 | 1/2002 | Iwamatsu | |
| 2002/0016059 | A1 | 2/2002 | Okada | |
| 2006/0223271 | A1 * | 10/2006 | Hara | H01L 27/1203 |
| | | | | 257/E23.179 |
| 2009/0225331 | A1 | 9/2009 | Van Haren | |
| 2010/0052191 | A1 | 3/2010 | Trogisch | |
| 2013/0328221 | A1 | 12/2013 | Tsai | |
| 2014/0167297 | A1 | 6/2014 | Tsai | |
| 2014/0264631 | A1 * | 9/2014 | Wei | H01L 23/544 |
| | | | | 257/401 |
| 2015/0061016 | A1 * | 3/2015 | Chiang | H01L 29/66795 |
| | | | | 438/689 |
| 2015/0091090 | A1 * | 4/2015 | Okuno | H01L 29/1602 |
| | | | | 438/401 |
| 2015/0123212 | A1 * | 5/2015 | Hu | H01L 21/3086 |
| | | | | 257/401 |
| 2015/0348913 | A1 * | 12/2015 | Hu | H01L 29/66795 |
| | | | | 257/48 |
| 2016/0141252 | A1 * | 5/2016 | Wei | H01L 21/76224 |
| | | | | 257/401 |
| 2017/0084494 | A1 * | 3/2017 | Chiang | H01L 29/785 |
| 2019/0198453 | A1 * | 6/2019 | Sekikawa | H01L 23/562 |
| 2019/0355668 | A1 * | 11/2019 | Rizzolo | H10B 61/00 |
| 2020/0037979 | A1 * | 2/2020 | Ferng | A61B 6/483 |
| 2020/0294796 | A1 * | 9/2020 | Azuma | H01L 21/0273 |
| 2022/0190143 | A1 * | 6/2022 | Erhu | H01L 21/823431 |

FOREIGN PATENT DOCUMENTS

| | | |
|---|---|---|
| CN | 107658290 A | 2/2018 |
| JP | S60229334 A | 11/1985 |
| JP | 2001237177 A | 8/2001 |
| JP | 2002353120 A | 12/2002 |
| JP | 2006013359 A | 1/2006 |
| WO | WO-2018125079 A1 * | 7/2018 |

OTHER PUBLICATIONS

Supplementary European Search Report in the European application No. 21779766.1, dated Aug. 8, 2023. 12 pages.
First Office Action of the Japanese application No. 2022-558353, dated Sep. 12, 2023. 8 pages with English translation.

* cited by examiner

FIG. 9

## SEMICONDUCTOR STRUCTURE AND METHOD FOR MANUFACTURING SAME

CROSS-REFERENCE TO RELATED APPLICATION

The present application is a U.S. continuation application of International Application No. PCT/CN2021/079803, filed on Mar. 9, 2021, which claims priority to Chinese patent application No. 202010236043.5, filed on Mar. 30, 2020. International Application No. PCT/CN2021/079803 and Chinese patent application No. 202010236043.5 are incorporated herein by reference in their entireties.

TECHNICAL FIELD

The examples of the present disclosure relate to the field of the semiconductor technology, and particularly relate to a semiconductor structure and a method for manufacturing the same.

BACKGROUND

With the improvement of the integration level of chips, the process for manufacturing the chips becomes more and more complicated. As a critical technology of the process for manufacturing integrated circuits, the photoetching process has put higher requirements to layer-to-layer alignment. However, with the increase in process complexity and the increase in number of layers to be photo-etched, how to optimize the functional structure and mark structure of a chip has become an urgent problem to be solved.

SUMMARY

In view of the above problem, the examples of the present disclosure provide a semiconductor structure and a method for manufacturing the same, to optimize the functional structure and mark structure of a chip.

In the first aspect, an example of the present disclosure provides a semiconductor structure. The semiconductor structure includes: a functional structure and a first mark structure located on a substrate, in which the functional structure and the first mark structure have a same feature size; and a first dielectric layer located at the functional structure and the first mark structure, in which a thickness of the first dielectric layer at the functional structure is different from a thickness of the first dielectric layer at the first mark structure.

In the second aspect, an example of the present disclosure further provides a method for manufacturing a semiconductor structure. The method includes the following operations.

A substrate is provided.

A functional structure and a first mark structure are formed on the substrate, and the functional structure and the first mark structure have a same feature size.

And, a first dielectric layer is formed at the functional structure and the first mark structure, and a thickness of the first dielectric layer at the functional structure is different from a thickness of the first dielectric layer at the first mark structure.

The examples of the present disclosure provide a semiconductor structure and a method for manufacturing a semiconductor structure. By setting the thickness of the first dielectric layer at the first mark structure to be different from the thickness of the first dielectric layer at the functional structure of the substrate, the first mark structure will have a higher imaging contrast, when the first mark structure is used as a mark during the process for manufacturing the semiconductor structure. Therefore, the accuracy of photoetching can be improved, and the product yield and the production efficiency can be improved at the same time.

DETAILED DESCRIPTION

The present disclosure will be further described in detail below with reference to the accompanying drawings and examples. It can be understood that the specific examples described herein are only used to explain the present disclosure, but not to limit the present disclosure. In addition, it should be noted that for ease of description, only a part of the structure related to the present disclosure is shown in the accompanying drawings, but not all of the structure.

Figure 1:
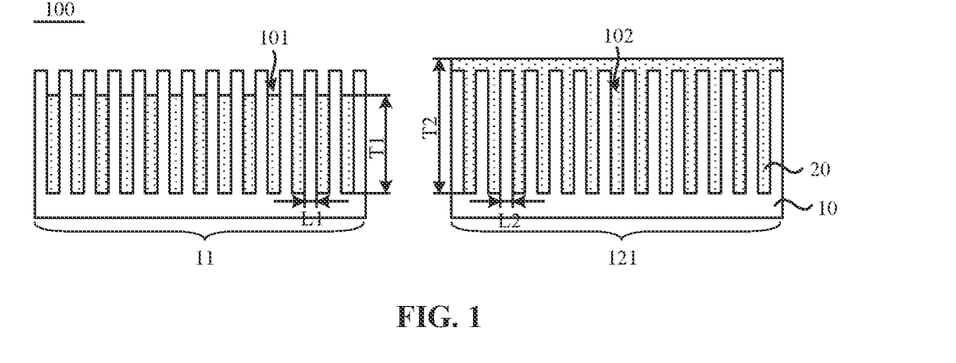
FIG. 1 schematically illustrates a structure of a semiconductor structure provided by an example of the present disclosure.

The examples of the present disclosure provide a semiconductor structure. FIG. 1 schematically illustrates a structure of a semiconductor structure provided by an example of the present disclosure. As shown in FIG. 1, a semiconductor structure 100 includes: a functional structure 11 and a first mark structure 121 located on a substrate 10, in which the functional structure 11 and the first mark structure 121 have a same feature size; and a first dielectric layer 20 located at the functional structure 11 and the first mark structure 121, in which a thickness of the first dielectric layer 20 at the functional structure 11 is different from a thickness of the first dielectric layer 20 at the first mark structure 121.

The substrate 10 may be a semiconductor substrate such as a silicon substrate, a gallium nitride substrate, a silicon carbide substrate, or Silicon on Insulator (SOI) substrate. The functional structure 11 and the first mark structure 121 on the substrate 10 may be formed by etching or photoetching. The formed functional structure 11 and the formed first mark structure 121 have the same feature size, and the feature size may be the smallest size and/or the smallest interval. The functional structure can form a corresponding device, and the first mark structure is used as a mark during the method for manufacturing the semiconductor structure, such as an alignment mark when using a photoetching machine for exposure or an overlay measurement mark. Of course, it is not limited to the mark used in the photoetching process.

Exemplarily, as shown in FIG. 1, the functional structure 11 and the first mark structure 121 are formed by etching the substrate 10 through photoetching and etching processes. In other examples, a dielectric layer may be formed on the substrate 10, and the dielectric layer is etched to form the functional structure and the first mark structure, or the substrate and the dielectric layer are etched to form the functional structure and the first mark structure. The functional structure 11 and the first mark structure 121 may include a plurality of saw-toothed grooves 101 and 102. Specifically, each of the grooves has the same size and/or adjacent grooves have the same interval therebetween. When the feature size of the functional structure 11 is equal to the interval L1 between two adjacent grooves 101 and the feature size of the first mark structure 121 is equal to the interval L2 between two adjacent grooves 102, the L1 is equal to the L2. That is, the first mark structure 121 and the functional structure 11 may have the same pattern shape.

The functional structure 11 and the first mark structure 121 may be prepared by Self-aligned Double Patterning (SADP) or Reverse Self-aligned Double Patterning (R-SADP). When the SADP/R-SADP process is used, a pattern structure having a very small size may be formed. For example, the size of the groove 101 and the groove 102 may be in range of 1 nm to 30 nm, such as 10 nm, 15 nm and 20 nm, and the interval L1 between the grooves 101 and the interval L2 between the grooves 102 may be in range of 1 nm to 30 nm, such as 10 nm, 15 nm and 20 nm. When the functional structure and the first mark structure are prepared by using the same process and have the same feature size, the detection or measurement result obtained from the first mark structure can better reflect the actual condition of the functional structure, thereby improving the process quality.

Figure 2:
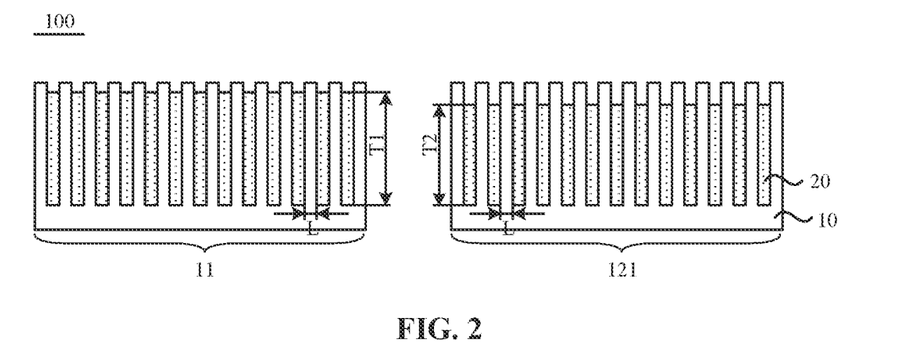
FIG. 2 schematically illustrates a structure of another semiconductor structure provided by an example of the present disclosure.

The first dielectric layer 20 is located at the functional structure 11 and the first mark structure 121, and a thickness of the first dielectric layer 20 at the functional structure 11 is different from a thickness of the first dielectric layer 20 at the first mark structure 121. That is, the thickness T2 of the first dielectric layer 20 at the first mark structure 121 may be greater than the thickness T1 of the first dielectric layer 20 at the functional structure 11 (as shown in FIG. 1). Alternatively, the thickness T2 of the first dielectric layer 20 at the first mark structure 121 may be smaller than the thickness T1 of the first dielectric layer 20 at the functional structure 11 (as shown in FIG. 2). Specifically, the first dielectric layer may be formed by various methods, such as Chemical Vapor Deposition (CVD) or Atomic Layer Deposition (ALD). The first dielectric layer may be of a single layer structure, such as silicon nitride or silicon oxide. The first dielectric layer may also be of a composite layer structure, such as a composite layer of silicon oxide and silicon nitride. When the first dielectric layer plays a role of isolation, the composite layer structure can bring out a better isolation effect. As an example, when the functional structure 11 and the first mark structure 121 include a plurality of saw-toothed grooves 101 and 102 as shown in FIG. 1, the thickness T2 of the first dielectric layer 20 at the first mark structure 121 is greater than the thickness T1 of the first dielectric layer 20 at the functional structure 11. Preferably, the thickness T2 of the first dielectric layer 20 at the first mark structure 121 may range, for example from 250 nm to 350 nm. The thickness T1 of the first dielectric layer 20 at the functional structure 11 is 50 nm to 100 nm smaller than the thickness T2 of the first dielectric layer 20 at the first mark structure 121. Specifically, the thickness T1 of the first dielectric layer 20 at the functional structure 11 is such as 150 nm, 200 nm, 250 nm or 300 nm, so that the imaging contrast of the first mark structure 121 can be increased on the premise of ensuring the normal function of the functional structure. Exemplarily, the first mark structure 121 may be used as an overlay measurement mark on the substrate for a first photoetching layer or an alignment mark when using a photoetching machine for exposure.

In the examples of the present disclosure, by forming the first dielectric layer 20 of which a thickness at the functional structure 11 is different from a thickness at the first mark structure 121 on the substrate 10, the thickness of the first dielectric layer 20 at the first mark structure 121 can meet the imaging requirement of the first mark structure during the alignment or measurement process. Therefore, when the first mark structure 121 of the semiconductor structure 100 is used as the alignment or measurement mark during the manufacturing process, it is possible to obtain an image of the first mark structure with a higher contrast. In this way, the first mark structure 121 with the higher imaging contrast can be used to perform the alignment or measurement in the manufacturing process, thereby improving the accuracy of alignment or measurement and improving the product yield and the production efficiency at the same time.

Figure 3:
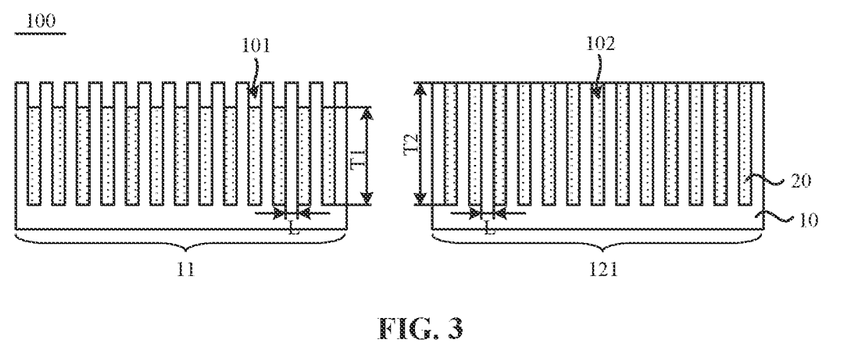
FIG. 3 schematically illustrates a structure of another semiconductor structure provided by an example of the present disclosure.

In an example, FIG. 3 schematically illustrates a structure of another semiconductor structure provided by an example of the present disclosure. As shown in FIG. 3, both the functional structure 11 and the first mark structure 121 of the substrate 10 include a plurality of saw-toothed grooves 101 and 102. In addition, the grooves 101 of the functional structure 11 and the grooves 102 of the first mark structure 121 are filled with the first dielectric layer 20. The height of the first dielectric layer 20 filling in each of the grooves 101 of the functional structure 11 is different from the height of the first dielectric layer 20 filling in each of the grooves 102 of the first mark structure 121.

Exemplarily, the height T1 of the first dielectric layer 20 filling in each of the grooves 101 of the functional structure 11 is smaller than the height T2 of the first dielectric layer 20 filling in each of the grooves 102 of the first mark structure 121. In this case, the first dielectric layer may be formed at both the functional structure 11 and the first mark structure 121 of the substrate. Then, a photoresist layer is formed on the first dielectric layer. The photoresist layer at the functional structure 11 is removed by a photoetching process. And then, part of the first dielectric layer at the functional structure 11 is removed by an etching process, so as to form the first dielectric layer 20 of which the thickness at the functional structure 11 is different from that at the first mark structure 121. In this way, in the method for manufacturing the semiconductor structure 100, the first dielectric layer 20 at the functional structure 11 of the substrate 10 is performed by a etch-back process, but the first dielectric layer at the first mark structure 121 of the substrate 10 is not subjected with a etch-back process, so that the thickness T1 of the first dielectric layer 20 at the functional structure 11 is smaller than the thickness T2 of the first dielectric layer 20 at the first mark structure 121.

In an example, continuing to refer to FIG. 3, when the functional structure 11 and the first mark structure 121 include a plurality of saw-toothed grooves, the height T2 of the first dielectric layer 20 filling in each of the grooves 102 of the first mark structure 121 is the same as the depth of each of the grooves 102 of the first mark structure 121.

Specifically, the grooves 102 are filled with a first dielectric material of the first dielectric layer 20, and the thickness of the filled first dielectric material is equal to the depth of each of the grooves 102. That is, the thickness of the first dielectric layer 20 formed at the first mark structure 121 is equal to the depth of each of the grooves of the first mark structure 121. Therefore, there is no need for an etch-back process, such as photoetching and etching processes. Thus, it is possible to reduce the number of process steps performed at the first mark structure 121, and prevent the etch-back process to be performed insufficient or excessive, which affects the thickness of the first dielectric layer 20 at the first mark structure 121 and then affects the imaging contrast of the first mark structure 121. In this way, when the height T2 of the first dielectric layer 20 filling in each of the grooves 102 of the first mark structure 121 is the same as the depth of the grooves 102 of the first mark structure 121, the difficulty of the process can be reduced, and the product yield can be improved.

For ease of description, all the examples of the present disclosure take the thickness of the first dielectric layer 20 at the first mark structure 121 the same as the depth of each of the grooves 102 of the first mark structure 121 as an example, so as to exemplarily illustrate the technical solutions of the examples of the present disclosure.

Figure 4:
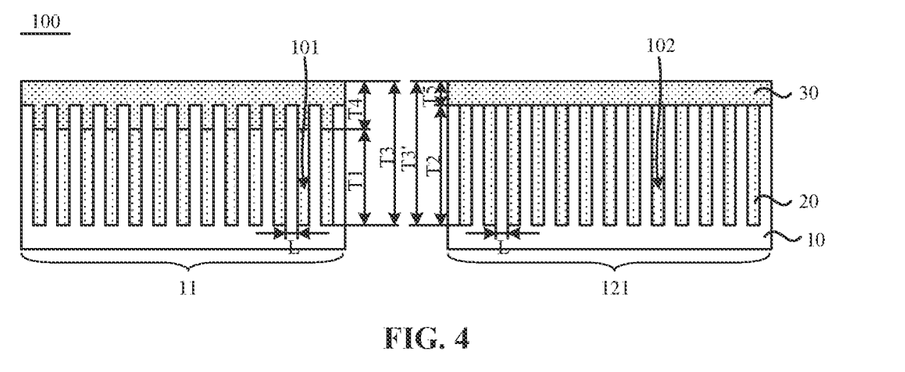
FIG. 4 schematically illustrates a structure of another semiconductor structure provided by an example of the present disclosure.

FIG. 4 schematically illustrates a structure of another semiconductor structure provided by an example of the present disclosure. As shown in FIG. 4, the first dielectric layer 20 is further covered with a second dielectric layer 30. The second dielectric layer 30 may be made by materials such as silicon nitride, silicon oxide, silicon oxynitride or silicon carbonitride.

Specifically, both the first dielectric layer 20 at the functional structure 11 and the first dielectric layer 20 at the first mark structure 121 are covered with the second dielectric layer 30. The second dielectric layer 30 can be configured to flatten the functional structure 11 and the first mark structure 121. In this case, the total thickness T3 of the first dielectric layer 20 and the second dielectric layer 30 at the functional structure 11 may be the same as the total thickness T3' of the first dielectric layer 20 and the second dielectric layer 30 at the first mark structure 121. That is, when the thickness T1 of the first dielectric layer 20 at the functional structure 11 is smaller than the thickness T2 of the first dielectric layer 20 at the first mark structure 121, the thickness T4 of the second dielectric layer 30 at the functional structure 11 is greater than the thickness T5 of the second dielectric layer 30 at the first mark structure 121, so that the total thickness T3 of the first dielectric layer 20 and the second dielectric layer 30 at the functional structure 11 is the same as the total thickness T3' of the first dielectric layer 20 and the second dielectric layer 30 at the first mark structure 121.

Figure 5:
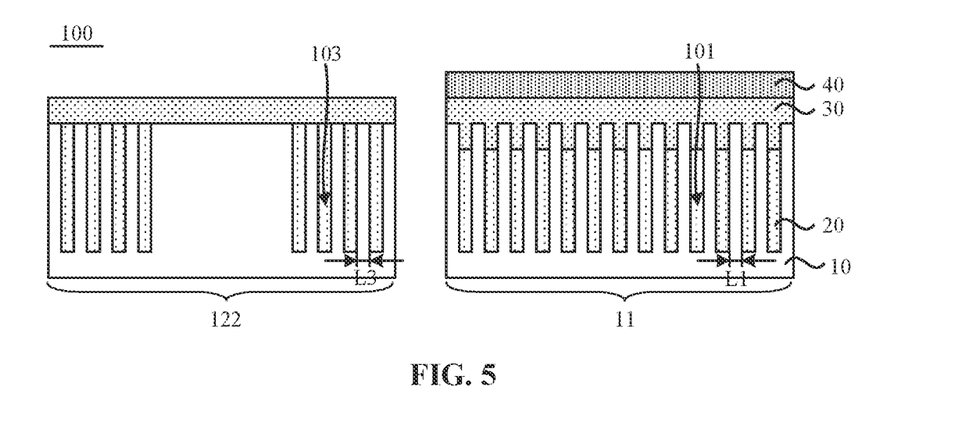
FIG. 5 schematically illustrates a structure of another semiconductor structure provided by an example of the present disclosure.

FIG. 5 schematically illustrates a structure of another semiconductor structure provided by an example of the present disclosure. As shown in FIG. 5, the semiconductor structure 100 further includes: a second mark structure 122 located on the substrate 10 and having the same feature size as the functional structure 11. That is, the smallest interval and/or smallest size of the second mark structure 122 is the same as the smallest interval and/or smallest size of the functional structure 11.

Exemplarily, as shown in FIG. 5, the second mark structure 122 may include a plurality of grooves 103, and the functional structure 11 may also include a plurality of grooves 101. In this case, the interval L1 between two adjacent grooves 101 may be equal to the smallest interval L3 between two adjacent grooves 103. The overall pattern shape of the second mark structure 122 may be different from the overall pattern shape of the functional structure 11. Exemplarily, the second mark structure 122 may be used as an overlay measurement mark on the substrate for a second photoetching layer or an alignment mark when using a photoetching machine for exposure.

In an example, continuing to refer to FIG. 5, the semiconductor structure 100 may further include a third dielectric layer 40. The third dielectric layer 40 only covers the second dielectric layer 30 at the functional structure 11, but does not cover the second dielectric layer 30 at the second mark structure 122.

Specifically, the third dielectric layer 40 may be a metal interconnection layer of the semiconductor structure 100, and used to realize signal transmission among devices of the semiconductor structure 100. In this case, the third dielectric layer 40 may be a metal layer, and the material of the metal layer may be tungsten, cobalt or aluminum. The third dielectric layer 40 may also be a composite conductive layer, such as a composite layer of titanium nitride and tungsten. The third dielectric layer 40 covers the second dielectric layer 30 at the functional structure, but does not cover the second dielectric layer 30 at the second mark structure 122, so as to prevent the second mark structure 122 from being shielded by the third dielectric layer 40 and then affecting the imaging contrast when using it to perform the manufacturing process. In this way, by forming the third dielectric layer 40 at the functional structure 11 and not forming the third dielectric layer 40 at the second mark structure 122, the second mark structure 122 meets the imaging requirement in the manufacturing process of the semiconductor structure 100, so that the second mark structure 122 may have a higher imaging contrast.

Figure 6:
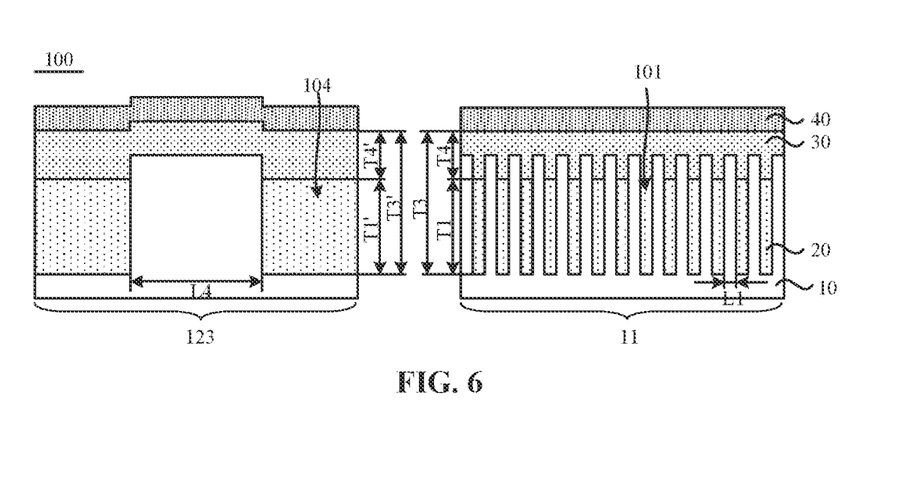
FIG. 6 schematically illustrates a structure of another semiconductor structure provided by an example of the present disclosure.

FIG. 6 schematically illustrates a structure of another semiconductor structure provided by an example of the present disclosure. As shown in FIG. 6, a third mark structure 123 is also disposed on the substrate 10, and the feature size of the third mark structure 123 is different from the feature size of the functional structure 11.

Exemplarily, as shown in FIG. 6, the third mark structure 123 may include a groove structure. The functional structure 11 may include a plurality of saw-toothed grooves 101, and the interval L1 between two adjacent grooves 101 is different from the smallest interval L4 between two adjacent grooves 104. That is, the feature size of the third mark structure 123 may be greater than the feature size of the functional structure 11. In this case, the pattern shape of the third mark structure 123 is different from the pattern shape of the functional structure 11. Exemplarily, the third mark structure 123 may be used as an overlay measurement mark on the first photoetching layer for the second photoetching layer or an alignment mark when using a photoetching machine for exposure.

Referring to FIG. 6, the thickness T1' of the first dielectric layer 20 in the grooves 104 of the third mark structure 123 is the same as the thickness T1 of the first dielectric layer 20 at the functional structure 11. That is, when the first dielectric layer 20 at the functional structure 11 is subjected with an etch-back process, the first dielectric layer 20 at the third mark structure 123 can be subjected with the etch-back process at the same time, so that the first dielectric layer 20 at the third mark structure 123 and the first dielectric layer 20 at the functional structure 11 have the same thickness.

In an example, continuing to refer to FIG. 6, the total thickness T3' of the first dielectric layer 20 and the second dielectric layer 30 in the grooves 104 of the third mark structure 123 is the same as the total thickness T3 of the first dielectric layer 20 and the second dielectric layer 30 at the functional structure 11. In this case, when the thickness T1' of the first dielectric layer 20 in the grooves 104 of the third mark structure 123 is the same as the thickness T1 of the first dielectric layer 20 at the functional structure 11, the thickness T4' of the second dielectric layer 30 at the third mark structure 123 is the same as the thickness T4 of the second dielectric layer 30 at the functional structure 11.

The third dielectric layer 40 at the third mark structure 123 may further cover the second dielectric layer at the third mark structure 123, so that the thickness of the film layer in the grooves 104 of the third mark structure 123 is the same as the thickness of the film layer at the functional structure 11. Furthermore, the height of the third dielectric layer 40 in the region of the third mark structure 123 excluding the grooves 104 is different from the height of the third dielectric layer in the grooves 104 of the third mark structure 123. By means of the arrangement, the imaging contrast of the third mark structure 123 can be enhanced, the compatibility among the processes for manufacturing the first mark structure, the second mark structure, the third mark structure, and the functional structure is improved, and the process cost is reduced.

In this way, when the semiconductor structure provided by the examples of the present disclosure includes the first mark structure, the second mark structure, the third mark structure and the functional structure on the substrate. When the first mark structure, the second mark structure, and the third mark structure have different functions, the structural design requirements for the first mark structure, the second mark structure and the third mark structure are different. Therefore, the imaging contrasts of the first mark structure, the second mark structure and the third mark structure at different photoetching layers can be enhanced, the compatibility among the processes for manufacturing the first mark structure, the second mark structure, the third mark structure and the functional structure is improved, and the process cost is reduced.

The examples of the present disclosure further provide a method for manufacturing a semiconductor structure. The method can be used to manufacture the semiconductor structure provided by the examples of the present disclosure. Therefore, the method also has the beneficial effects of the semiconductor structure provided by the examples of the present disclosure. Regarding the similarities, reference may be made to the foregoing description with respect to the semiconductor structure.

Figure 7:
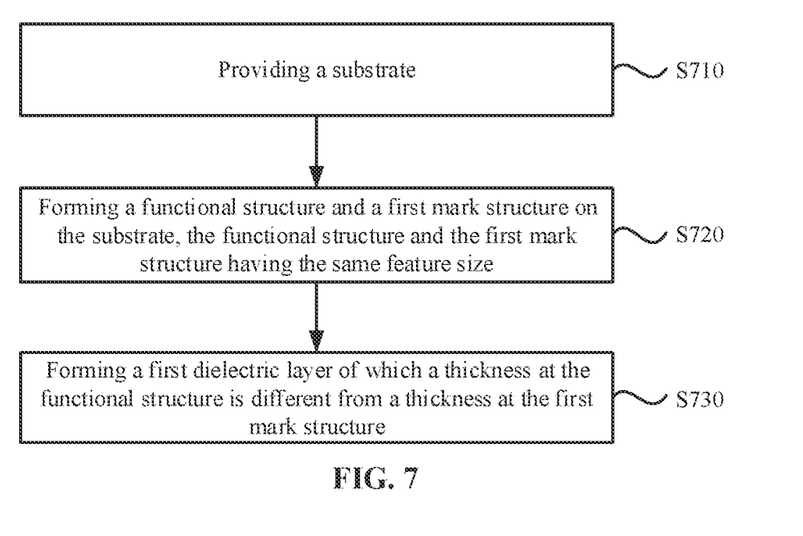
FIG. 7 shows a flowchart of a method for manufacturing a semiconductor structure provided by an example of the present disclosure.

FIG. 7 shows a flowchart of a method for manufacturing a semiconductor structure provided by an example of the present disclosure. As shown in FIG. 7, the manufacturing method includes the following operations.

At S710, a substrate is provided.

At S720, a functional structure and a first mark structure are formed on the substrate, and the functional structure and the first mark structure have the same feature size.

At S730, a first dielectric layer is formed at the functional structure and the first mark structure, and the thickness of the first dielectric layer at the functional structure is different from the thickness of the first dialectic layer at the first mark structure.

Exemplarily, the substrate may be a semiconductor substrate such as a silicon substrate, a gallium nitride substrate, a silicon carbide substrate, or a silicon-on-insulator (SOI) substrate. In this case, patterns of the functional structure and the first mark structure may be respectively formed on the substrate by means of etching. In other examples, a dielectric layer may be formed on the substrate. The dielectric layer is etched to form the functional structure and the first mark structure, or the substrate and the dielectric layer are etched to form the functional structure and the first mark structure. The formed first mark structure and the formed functional structure may include a plurality of saw-toothed grooves. The thickness of the first dielectric layer at the functional structure is different from the thickness of the first dielectric layer at the first mark structure. That is, the thickness of the first dielectric layer at the functional structure may be smaller than the thickness of the first dielectric layer at the first mark structure, or the thickness of the first dielectric layer at the functional structure may be greater than the thickness of the first dielectric layer at the first mark structure.

In an example, taking the thickness of the first dielectric layer at the functional structure being smaller than the thickness of the first dielectric layer at the first mark structure as an example, the method for forming a first dielectric layer whose thickness at the functional structure is different from the thickness thereof at the first mark structure may include the following operations. A first dielectric layer is formed on the substrate. And, a photoresist layer is formed on the first dielectric layer. The photoresist layer at the functional structure is removed by a manufacturing process, and part of the first dielectric layer at the functional structure is removed by an etching process to form the first dielectric layer of which the thickness at the functional structure is smaller than the thickness at the first mark structure. Exemplarily, a mask layer is also formed between the first dielectric layer and the photoresist layer.

The first dielectric layer may be formed by depositing a first dielectric material on the entire substrate by means of vapor deposition or atomic layer deposition. The photoresist layer may be formed by spin-coating a photoresist on the first dielectric layer. The photoresist layer is subjected to exposure and development. After that, the photoresist layer at the functional structure is removed, and the photoresist layer at the first mark structure is retained. In this case, the first dielectric layer at the functional structure can be etched by a corresponding etching solution. Since the photoresist layer at the first mark structure is not removed, the photoresist layer at the first mark structure can protect the first dielectric layer at the first mark structure from being etched. In this way, part of the first dielectric layer at the functional structure is etched, but the first dielectric layer at the first mark structure is not etched, thereby forming the first dielectric layer whose thicknesses at the functional structure is different form the thickness thereof at the first mark structure.

In an example, while the functional structure and the first mark structure are formed on the substrate, the second mark structure and the third mark structure may also be formed on the substrate. In addition, the second mark structure has the same feature size as the functional structure, and the third mark structure has different feature sizes from the functional structure.

In this way, the first mark structure, the second mark structure, the third mark structure, and the functional structure can be formed at the same time by one etching. And, the obtained first mark structure, second mark structure, third mark structure, and functional structure have different functions on the semiconductor structure. Exemplarily, the functional structure may form a corresponding device; the first mark structure may be used as an overlay measurement mark on the substrate for the first photoetching layer or an alignment mark when using a photoetching machine for exposure; the second mark structure may be used as an overlay measurement mark on the substrate for the second photoetching layer or an alignment mark when using a photoetching machine for exposure; and the third mark structure may be used as an overlay measurement mark on the first photoetching layer for the second photoetching layer or an alignment mark when using a photoetching machine for exposure.

In an example, the first dielectric layer is further formed at the second mark structure and the third mark structure. In addition, the thickness of the first dielectric layer formed at the second mark structure is equal to the thickness of the first dielectric layer formed at the first mark structure, and the thickness of the first dielectric layer formed at the third mark structure is different from the thickness of the first dielectric layer formed at the second mark structure.

Exemplarily, the process for forming the first dielectric layer on each of the mark structures and on the functional structure may include the following operations. A first dielectric material is deposited on the substrate to form a whole layer of first dielectric layer. A photoresist layer is spin-coated on the first dielectric layer, and the photoresist layer is exposed and developed to remove the photoresist layer at the functional structure and the third mark structure. And the first dielectric layer at the functional structure and the third mark structure is etched to remove part of the first dielectric layer at the functional structure and the third mark structure, so that the thickness of the first dielectric layer formed at the third mark structure is different from the thickness of the first dielectric layer formed at the first mark structure and the second mark structure.

Figure 8:
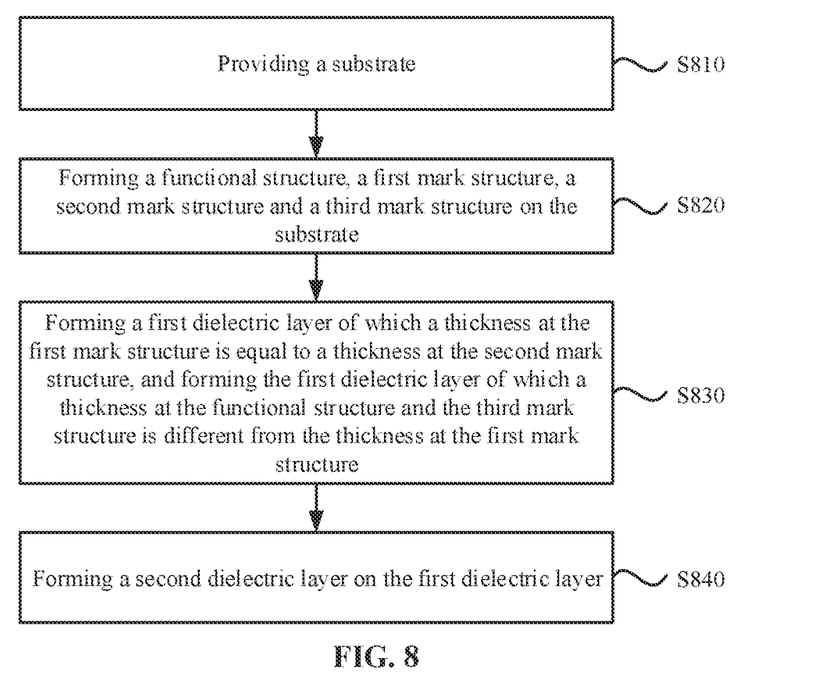
FIG. 8 shows a flowchart of another method for manufacturing a semiconductor structure provided by an example of the present disclosure.

In an example, FIG. 8 shows a flowchart of another method for manufacturing a semiconductor structure provided by an example of the present disclosure. As shown in FIG. 8, the method for manufacturing the semiconductor structure includes the following operations.

At S810, a substrate is provided.

At S820, a functional structure, a first mark structure, a second mark structure and a third mark structure are formed on the substrate. In addition, the first mark structure, the second mark structure, and the functional structure have the same feature size, and the third mark structure and the functional structure have different feature sizes.

At S830, a first dielectric layer is formed at the first mark structure and the second mark structure, and the thickness of the first dielectric at the first mark structure is the same as the thickness of the second mark structure. The first dielectric layer is further formed at the functional structure and the third mark structure, and the thickness of the first dielectric layer at the functional structure and the third mark structure is different from that of the first dielectric layer at the first mark structure.

At S840, a second dielectric layer is formed on the first dielectric layer, and the sums of the thicknesses of the first dielectric layer and the second dielectric layer formed at the functional structure, at the first mark structure, at the second mark structure and at the third mark structure are the same.

The second dielectric layer may be deposited on the first dielectric layer by means of vapor deposition or atomic layer deposition to form a whole layer of second dielectric layer, so that the sums of the thicknesses of the second dielectric layer and the first dielectric layer formed at the functional structure, at the first mark structure, at the second mark structure and at the third mark structure are the same.

Figure 9:
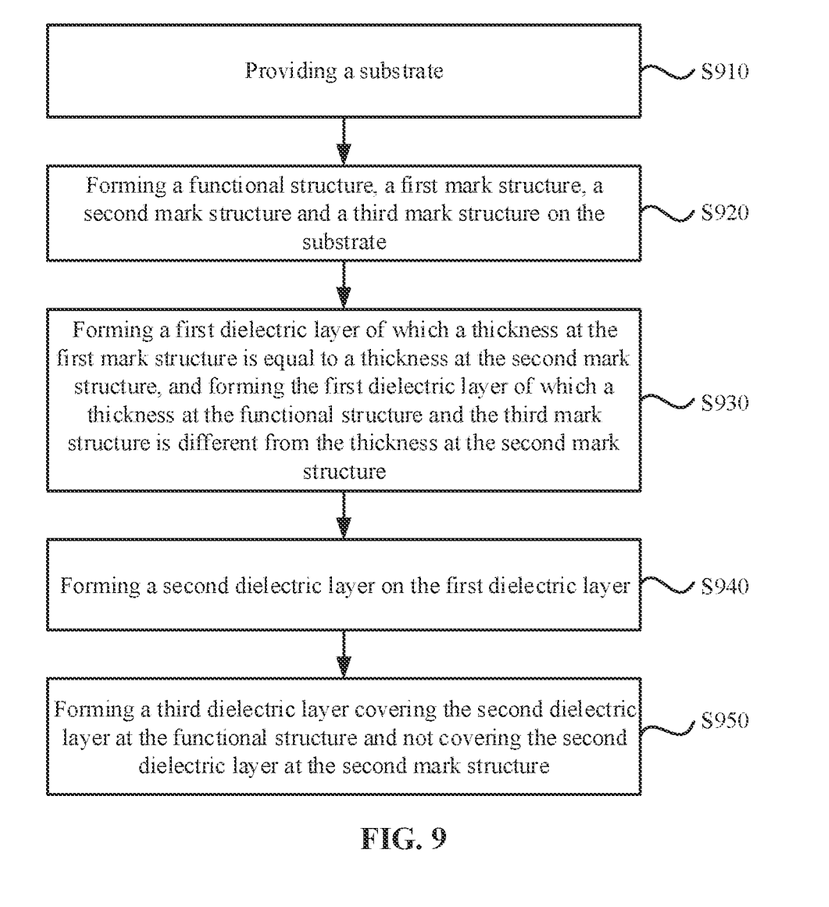
FIG. 9 shows a flowchart of another method for manufacturing a semiconductor structure provided by an example of the present disclosure.

In an example, FIG. 9 shows a flowchart of another method for manufacturing a semiconductor structure provided by an example of the present disclosure. As shown in FIG. 9, the method for manufacturing the semiconductor structure includes the following operations.

At S910, a substrate is provided.

At S920, a functional structure, a first mark structure, a second mark structure and a third mark structure are formed on the substrate.

At S930, a first dielectric layer is formed at the first mark structure and the second mark structure, and the thickness of the first dielectric at the first mark structure is the same as the thickness of the second mark structure. The first dielectric layer is further formed at the functional structure and the third mark structure, and the thickness of the first dielectric layer at the functional structure and the third mark structure is different from that of the first dielectric layer at the first mark structure.

At S940, a second dielectric layer is formed on the first dielectric layer, and the sums of the thicknesses of the first dielectric layer and the second dielectric layer formed at the functional structure, at the first mark structure, at the second mark structure and at the third mark structure are the same.

At S950, a third dielectric layer covering the second dielectric layer is formed at the functional structure and the third mark structure, and the third dielectric layer covering the second dielectric layer is not formed at the second mark structure.

Exemplarily, the process for forming the third dielectric layer covering the second dielectric layer at the functional structure and the third mark structure, and not forming the third dielectric layer covering the second dielectric layer at the second mark structure specifically includes the following operations. The third dielectric layer is formed on the second dielectric layer at the functional structure. The third mark structure and the second mark structure. A mask layer and a photoresist layer are sequentially formed on the third dielectric layer, the photoresist layer at the second mark structure is removed by a manufacturing process, and the mask layer and the third dielectric layer at the second mark structure are removed by an etching process to form the third dielectric layer covering the second dielectric layer at the functional structure and the third mark structure. The third dielectric layer at the second mark structure is removed. That is, the third dielectric layer does not cover the second dielectric layer at the second mark structure. The third dielectric layer may be formed on the second dielectric layer by means of vapor deposition or atomic layer deposition.

It should be noted that the above descriptions are only the preferred examples of the present disclosure and the applied technical principles. Those skilled in the art can understand that the present disclosure is not limited to the specific examples described herein. For those skilled in the art, various obvious changes, readjustments, mutual combination, and replacements can be made without departing from the protection scope of the present disclosure. Therefore, although the present disclosure is described in more detail through the above examples, the present disclosure is not limited to the above examples. Without departing from the concept of the present disclosure, the present disclosure may further include more other equivalent examples. The scope of the present disclosure is determined by the scope of the appended claims.

The invention claimed is:

1. A semiconductor structure, comprising:
   a functional structure and a first mark structure located on a substrate, wherein the functional structure and the first mark structure have a same feature size and a same pattern shape; and a first dielectric layer located at the functional structure and the first mark structure, wherein a thickness of the first dielectric layer at the functional structure is different from a thickness of the first dielectric layer at the first mark structure; and wherein the functional structure and the first mark structure comprise a plurality of saw-toothed grooves, each of the saw-toothed grooves is filled with the first dielectric layer, and a height of the first dielectric layer filling in each of the saw-toothed grooves of the functional structure is different from a height of the first dielectric layer filling in each of the saw-toothed grooves of the first mark structure.

2. The semiconductor structure of claim 1, wherein
the thickness of the first dielectric layer at the first mark structure is in a range of 250 nm to 350 nm; and
the thickness of the first dielectric layer at the functional structure is 50 nm to 100 nm smaller than the thickness of the first dielectric layer at the first mark structure.

3. The semiconductor structure of claim 1, further comprising:
a second dielectric layer covering the first dielectric layer.

4. The semiconductor structure of claim 3, wherein a total thickness of the first dielectric layer and the second dielectric layer at the functional structure is equal to a total thickness of the first dielectric layer and the second dielectric layer at the first mark structure.

5. The semiconductor structure of claim 1, wherein the height of the first dielectric layer filling in each of the saw-toothed grooves of the functional structure is smaller than the height of the first dielectric layer filling in each of the saw-toothed grooves of the first mark structure.

6. The semiconductor structure of claim 5, wherein the height of the first dielectric layer filling in each of the saw-toothed grooves of the first mark structure is equal to a depth of each of the saw-toothed grooves of the first mark structure.

7. The semiconductor structure of claim 3, further comprising:
a second mark structure located on the substrate, wherein the functional structure and the second mark structure have a same feature size.

8. The semiconductor structure of claim 7, further comprising:
a third dielectric layer covering the second dielectric layer at the functional structure and not covering the second dielectric layer at the second mark structure.

9. The semiconductor structure of claim 8, further comprising:
a third mark structure located on the substrate, wherein the functional structure and the third mark structure have different feature sizes.

10. The semiconductor structure of claim 9, wherein a thickness of the first dielectric layer at the third mark structure is equal to the thickness of the first dielectric layer at the functional structure.

11. The semiconductor structure of claim 10, wherein a total thickness of the first dielectric layer and the second dielectric layer at the third mark structure is equal to a total thickness of the first dielectric layer and the second dielectric layer at the functional structure.

12. The semiconductor structure of claim 11, wherein the third dielectric layer at the third mark structure covers the second dielectric layer.

13. A method for manufacturing a semiconductor structure, comprising:
providing a substrate;
forming a functional structure and a first mark structure on the substrate, wherein the functional structure and the first mark structure have a same feature size; and
forming a first dielectric layer of which a thickness at the functional structure is different from a thickness at the first mark structure;
wherein the forming the first dielectric layer of which the thickness at the functional structure is different from the thickness at the first mark structure comprises:
forming the first dielectric layer on the substrate; and
forming a photoresist layer on the first dielectric layer, removing the photoresist layer at the functional structure by a manufacturing process, and removing part of the first dielectric layer from the functional structure by an etching process to form the first dielectric layer of which the thickness at the functional structure is smaller than the thickness at the first mark structure.

14. The method of claim 13, further comprising:
forming a second mark structure and a third mark structure on the substrate, wherein the second mark structure and the functional structure have a same feature size, and the third mark structure and the functional structure have different feature sizes.

15. The method of claim 14, wherein the first dielectric layer is further formed at the second mark structure and the third mark structure, a thickness of the first dielectric layer at the second mark structure is equal to the thickness of the first dielectric layer at the first mark structure, and a thickness of the first dielectric layer at the third mark structure is different from the thickness of the first dielectric layer at the second mark structure.

16. The method of claim 15, further comprising:
forming a second dielectric layer on the first dielectric layer, wherein sums of the thickness of the first dielectric layer and a thickness of the second dielectric layer at the functional structure, at the first mark structure, at the second mark structure and at the third mark structure are equal.

17. The method of claim 16, further comprising:
forming a third dielectric layer covering the second dielectric layer at the functional structure and the third mark structure, and not forming the third dielectric layer covering the second dielectric layer at the second mark structure.

18. The method for manufacturing the semiconductor structure of claim 17, wherein the forming the third dielectric layer covering the second dielectric layer at the functional structure and the third mark structure, and not forming the third dielectric layer covering the second dielectric layer at the second mark structure comprises:
forming the third dielectric layer on the second dielectric layer at the functional structure, the third mark structure and the second mark structure; and
sequentially forming a mask layer and a photoresist layer on the third dielectric layer, removing the photoresist layer from the second mark structure by a second manufacturing process, and removing the mask layer and the third dielectric layer from the second mark structure by a second etching process to form the third dielectric layer covering the second dielectric layer at the functional structure and the third mark structure but not covering the second dielectric layer at the second mark structure.

19. A semiconductor structure, comprising:
- a functional structure and a first mark structure located on a substrate, wherein the functional structure and the first mark structure have a same feature size;
- a first dielectric layer located at the functional structure and the first mark structure, wherein a thickness of the first dielectric layer at the functional structure is different from a thickness of the first dielectric layer at the first mark structure;
- a second dielectric layer covering the first dielectric layer;
- a second mark structure located on the substrate, wherein the functional structure and the second mark structure have a same feature size; and
- a third dielectric layer covering the second dielectric layer at the functional structure and not covering the second dielectric layer at the second mark structure.

20. The semiconductor structure of claim 19, further comprising:
- a third mark structure located on the substrate, wherein the functional structure and the third mark structure have different feature sizes.

* * * * *